US012586992B2

(12) United States Patent
Wang et al.

(10) Patent No.: US 12,586,992 B2
(45) Date of Patent: Mar. 24, 2026

(54) SCALABLE RECONFIGURABLE APPARATUS AND METHODS FOR ELECTRIC POWER SYSTEM EMULATION

(71) Applicant: UNIVERSITY OF TENNESSEE RESEARCH FOUNDATION, Knoxville, TN (US)

(72) Inventors: Fei Wang, Knoxville, TN (US); Jingxin Wang, Knoxville, TN (US); Yiwei Ma, Knoxville, TN (US)

(73) Assignee: UNIVERSITY OF TENNESSEE RESEARCH FOUNDATION, Knoxville, TN (US)

( * ) Notice: Subject to any disclaimer, the term of this patent is extended or adjusted under 35 U.S.C. 154(b) by 0 days.

(21) Appl. No.: 18/424,250

(22) Filed: Jan. 26, 2024

(65) Prior Publication Data

US 2024/0170929 A1     May 23, 2024

Related U.S. Application Data

(62) Division of application No. 17/150,650, filed on Jan. 15, 2021, now Pat. No. 11,923,666.

(51) Int. Cl.
*H02B 1/22* (2006.01)
*G06F 1/18* (2006.01)
(Continued)

(52) U.S. Cl.
CPC .............. *H02B 1/22* (2013.01); *G06F 1/189* (2013.01); *H02B 1/20* (2013.01); *H02J 11/00* (2013.01); *H05K 7/14* (2013.01); *H03K 17/693* (2013.01)

(58) Field of Classification Search
None
See application file for complete search history.

(56) References Cited

U.S. PATENT DOCUMENTS

| | | | | | |
|---|---|---|---|---|---|
| 5,051,888 A | * | 9/1991 | Hansen | ................. | G06F 11/261 |
| | | | | | 703/23 |
| 5,644,515 A | | 7/1997 | Sample | | |

(Continued)

OTHER PUBLICATIONS

Jiminez et al., Analysis of Reconfigurable Tap Changing Transformer Model Through Analog Emulation, IEEE 2009.

(Continued)

*Primary Examiner* — Courtney L Smith
(74) *Attorney, Agent, or Firm* — Stanek Lemon Crouse & Meeks, PA

(57) ABSTRACT

An electric power system emulator apparatus includes a plurality of nodes arrayed in first and second dimensions and a plurality of transmission path emulator circuits, respective ones of which are configured to be connected between adjacent ones of the nodes in the first and second dimensions. The apparatus further includes a control circuit configured to control the transmission path emulator circuits to emulate transmission paths of an electric power system. The control circuit may be configured to control the transmission path emulator circuits to emulate transmission lines and/or transformers. The transmission path emulator circuits may include respective power electronics converter circuits. The apparatus may further include source/load emulator circuits configured to be coupled to the nodes.

15 Claims, 11 Drawing Sheets

(51) Int. Cl.

| | |
|---|---|
| *H02B 1/20* | (2006.01) |
| *H02J 11/00* | (2006.01) |
| *H05K 7/14* | (2006.01) |
| *H03K 17/693* | (2006.01) |

(56) References Cited

U.S. PATENT DOCUMENTS

| | | | |
|---|---|---|---|
| 6,885,915 | B2 | 4/2005 | Rehtanz |
| 7,679,941 | B2 * | 3/2010 | Raju .................... H02M 7/217 |
| | | | 363/71 |
| 7,765,497 | B2 | 7/2010 | Cheng |
| 8,434,027 | B2 | 4/2013 | Jones |
| 10,873,184 | B2 | 12/2020 | Wang et al. |
| 10,965,124 | B2 | 3/2021 | Laval et al. |
| 10,973,184 | B1 | 4/2021 | Yin |
| 11,183,991 | B2 | 11/2021 | Stroh |
| 2008/0204131 | A1 | 8/2008 | Roberts |
| 2010/0085783 | A1 | 4/2010 | Jiang-Hafner |
| 2010/0332211 | A1 * | 12/2010 | Oudalov ................ G05B 17/02 |
| | | | 703/23 |
| 2012/0105072 | A1 | 5/2012 | Peterson |
| 2013/0258732 | A1 | 10/2013 | Zhu et al. |
| 2016/0248341 | A1 | 8/2016 | Trainer et al. |
| 2016/0252579 | A1 | 9/2016 | Kondo |
| 2016/0329811 | A1 * | 11/2016 | Du .......................... H02M 1/14 |
| 2017/0346677 | A1 | 11/2017 | Suryanarayna |
| 2018/0024204 | A1 | 1/2018 | Novak |
| 2018/0115164 | A1 | 4/2018 | Gupta et al. |
| 2018/0204138 | A1 | 7/2018 | Nugent |
| 2018/0336075 | A1 | 11/2018 | Caims |
| 2019/0109891 | A1 * | 4/2019 | Paruchuri ............. G06Q 50/06 |
| 2020/0127456 | A1 * | 4/2020 | Wang ................... G05B 13/041 |
| 2021/0036646 | A1 * | 2/2021 | Sul ........................ G05B 17/02 |
| 2022/0229406 | A1 | 7/2022 | Wang et al. |

OTHER PUBLICATIONS

Wang et al; U.S. Appl. No. 17/150,567 entitled Power Electronics Converter Based Transformer Emulator, filed Jan. 15, 2021, 22 pages.

* cited by examiner 1000-1                           1000-2

1000-1

1000-2

SCALABLE RECONFIGURABLE APPARATUS AND METHODS FOR ELECTRIC POWER SYSTEM EMULATION

CROSS-REFERENCE TO RELATED APPLICATIONS

The present application is a divisional application and claims the benefit of U.S. patent application Ser. No. 17/150,650 entitled SCALABLE AND RECONFIGURABLE APPARATUS AND METHODS FOR ELECTRIC POWER SYSTEM EMULATION, filed Jan. 15, 2021, the disclosure of which is hereby referenced in its entirety.

STATEMENT OF GOVERNMENT INTEREST

The invention was made with government support under Award Number EEC-1041877 awarded by the National Science Foundation. The government has certain rights in the invention.

BACKGROUND

The inventive subject matter relates to apparatus and methods for analysis of electrical power systems and, more particularly, to apparatus and methods for emulating electrical power systems.

The design and operation of electrical power systems (e.g., utility grids) commonly involves simulation and/or emulation using tools such as digital simulators, analog hardware emulators, or mixed digital-analog signal emulators. Computer-implemented simulation can provide advantages, such as relatively low cost and reconfigurability, but software-based simulators may have difficulty dealing with multi-timescale models and may suffer from numerical stability and convergence issues. Analog hardware-based emulators can provide advantages such as realism, actual communication and sensors, and that ability to reveal the impact of the aspects that may be overlooked by digital simulation, such as delay, measurement errors, and electromagnetic interference. However, such emulators can be bulky and inflexible and may exhibit model fidelity issues when scaled. Mixed digital-analog signal emulators, such as described in U.S. Patent Application Publication No. 2010/0332211, are more flexible compared to scaled analog hardware-based emulators. However, they also may exhibit model fidelity issues especially with their unscalable line emulation method.

Emulators that utilize power electronics-based converters have been proposed in, for example, U.S. Pat. No. 10,873,184 to Wang et al. Such systems can provide more realistic behavior comparison to digital simulation and may be more flexible than other hardware-based platforms. However, these emulators may have limited flexibility and scalability.

SUMMARY

In some embodiments, an electric power system emulator apparatus includes a plurality of nodes arrayed in first and second dimensions and a plurality of transmission path emulator circuits, respective ones of which are configured to be connected between adjacent ones of the nodes in the first and second dimensions. The apparatus further includes a control circuit configured to control the transmission path emulator circuits to emulate transmission paths of an electric power system. The control circuit may be configured to control the transmission path emulator circuits to emulate transmission lines and/or transformers, sources and/or loads. The transmission path emulator circuits may include respective power electronics converter circuits. In some embodiments, each of the power electronics converter circuits may include first, second and third power electronics converter circuits and a DC bus coupling DC ports of the first, second and third power electronics converter circuits.

In further embodiments, the apparatus may further include switches configured to couple and decouple the emulator circuits to and from the nodes of the array. Respective bypass circuits may be configured to bypass respective ones of the transmission path emulator circuits. The switches and/or the bypass circuits may be incorporated into the emulator circuits.

The apparatus may further include a plurality of source/load emulator circuits, respective ones of which are configured to be coupled to respective ones of the nodes. The control circuit may be configured to operate the source/load emulator circuits to emulate loads and/or sources of the electric power system. The source/load emulator circuits may include respective power electronics converter circuits.

In still further embodiments, the transmission path emulator circuits may include DC transmission path emulator circuits including first, second, third, and fourth power electronics converter circuits.

According to some aspects, the nodes and transmission path emulator circuits may be implemented in a plurality of interconnected modules, each module comprising one or more of the transmission path emulator circuits. The modules may be contained in respective circuit cards configured to be installed in a chassis. The modules may each include at least one source/load emulator circuit.

Some embodiments provide an electric power system emulator apparatus including a chassis, a plurality of emulator modules in the chassis. Each of the emulator modules includes first and second transmission path emulator circuits, each having first ports configured to be connected to one another and second ports configured to be connected to another of the emulator modules, a source/load emulator circuit configured to be connected to the first ports of the first and second transmission path emulator circuits, and a control circuit configured to control the first and second transmission path emulator circuits and the source/load emulator circuit.

Methods of emulating an electric power system include selectively interconnecting nodes of an array of nodes having first and second dimensions using a plurality of emulator circuits, respective ones of which are configured to be connected between adjacent nodes of the array in the first and second dimensions and controlling the emulator circuits to emulate transmission paths of the electric power system. The methods may further include coupling second emulator circuits to respective nodes of the array and controlling the second emulator circuits to emulate loads and/or sources of the electric power system. The second emulator circuit may include respective power electronics converter circuits.

DETAILED DESCRIPTION

Figure 1:
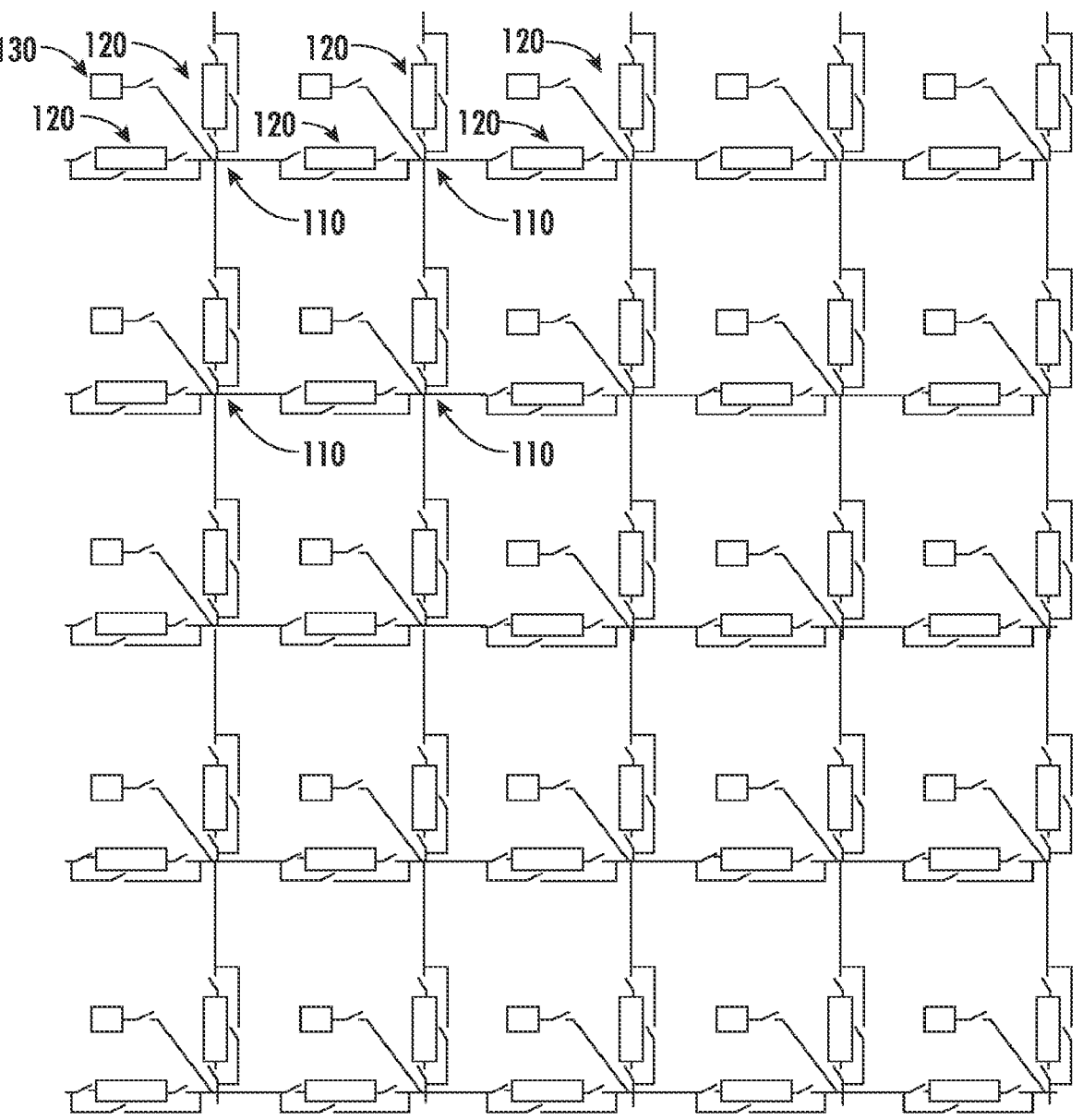
FIG. 1 is schematic diagram illustrating a reconfigurable and scalable electric power system emulator architecture according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Some embodiments of the inventive subject matter can provide software configurable and scalable power electronics converter based electric power system emulation platforms that are also cost effective and size-efficient. Compared with digital simulation, electric power system emulation platforms according to some embodiments can provide greater test fidelity with little or no numerical stability and convergence issues. Compared to conventional scaled analog hardware-based emulators, power electronics converter based electric power system emulation platforms according to some embodiments can provide more accurate emulation results. Compared to prior power electronics converter based emulators, software configurable and scalable electric power system emulation platform according to some embodiments can provide easier system topology configuration, better scalability, and larger-scale system emulation capability. Compared to mixed digital-analog signal power system emulation platform, software configurable and scalable power electronics converter based electric power system emulation platform according to some embodiments can provide more accurate emulation results.

Some embodiments provide software configurable and scalable electric power system emulation platform that use a matrix structure for relatively easy implementation of various electrical power systems topologies. In particular, such a matrix structure may include an array of nodes selectively interconnectable by AC/AC converter circuits that can emulate AC transmission lines and/or transformers, along with DC/AC converter circuits that are selectively connectable to the nodes to emulate sources and loads. It may also include a plurality of DC/AC and AC/DC converter circuits that can emulate DC transmission lines, along with AC/DC converter circuits that are selectively connectable to the DC transmission lines to emulate DC stations. The converters can be organized as interconnectable modules that can be interconnected in, for example, a rack/chassis arrangement that supports easy scalability. Thus, this architecture can support emulation of small-scale and/or low power or voltage systems (e.g., microgrids and autonomous electrical systems), and large-scale and/or high power or voltage systems (e.g., utility transmission grids or large portions thereof).

Figure 2:
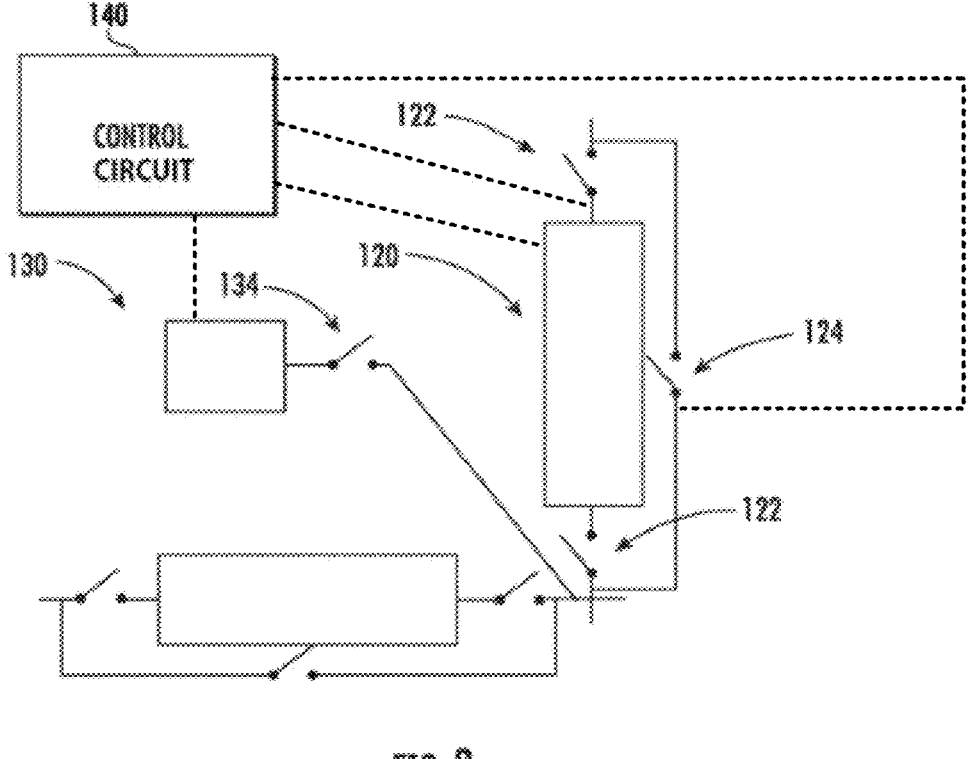
FIG. 2 is a detailed view of a portion of the electric power system emulator of FIG. 1.

FIG. 1 illustrates an electrical power system emulator apparatus according to some embodiments of the inventive subject matter, while FIG. 2 provides a detailed view of a portion of the emulator apparatus of FIG. 1. Referring to FIGS. 1 and 2, the emulator apparatus includes a plurality of nodes 110 that are arrayed as a rectangular matrix along first and second dimensions. For conceptual purposes, the nodes 110 are illustrated shown in FIG. 1 as arrayed in a common plane, but it will be appreciated that the first and second dimensions are not limited to this particular spatial arrangement. Rather, the "first dimension" and the "second dimension" described herein refer to topological relationships, i.e., the nodes are arranged in first and second dimensions in terms of the manner in which they are electrically interconnected, and such interconnection is not limited to the planar arrangement shown in FIG. 1. For example, non-planar but topologically two-dimensional arrangements are discussed below with reference to FIGS. 7-9. It will be further appreciated that the concepts shown herein may be extended to further dimensions. For example, a three-dimensional arrangement could be provided that includes one or more planar matrices of the type shown in FIG. 1 oriented perpendicular to the matrix shown in FIG. 1 (e.g., plural parallel matrices coinciding with respective columns of the matrix of FIG. 1) and interconnected with the nodes 110 thereof.

As further shown in FIGS. 1 and 2, transmission path emulator circuits 120 are configured to selectively interconnect adjacent ones of the nodes 110 along the first and second dimensions of the array of nodes 110. The transmission path emulator circuits 120 may be configured to emulate behavior of power system transmission elements, such as transmission lines and transformers.

Figure 3:
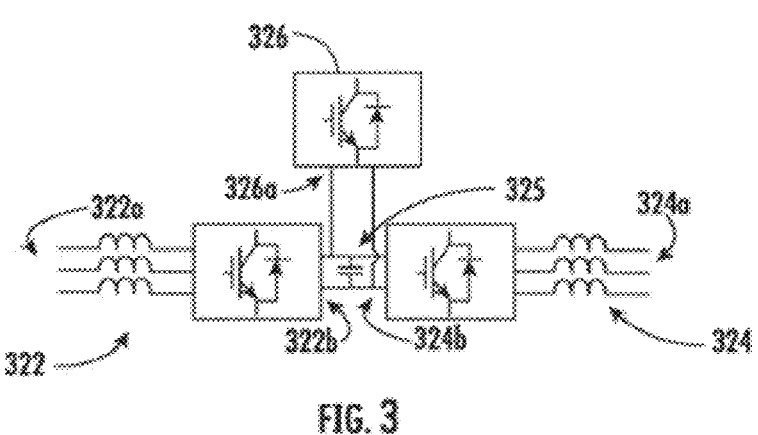
FIGS. 3 and 4 are schematic diagrams illustrating architectures that may be used for converters of the electric power system emulator of FIG. 1 according to some embodiments.

The transmission path emulators 120 may take any of a variety of forms. For example, the transmission path emulators 120 could take the form of transmission line emulators described in the aforementioned U.S. Pat. No. 10,873,184 to Wang et al., the disclosure of which is incorporated by reference herein in its entirety. In some embodiments, the transmission path emulators 120 may also take the form illustrated in FIG. 3, which includes a combination of power electronics converter circuits, including a first converter circuit 322 having an AC port 322a configured to be connected to a first one of the nodes 110 and DC port 322b connected to a DC bus 325, a second converter circuit 324 having an AC port 324a configured to be connected to a second one of the nodes 110 and a DC port 324b connected to the DC bus 325, and a third converter circuit 326 having a DC port 326a coupled to the DC bus 325. As illustrated, the first and second converter circuits 322, 324 may be three-phase converter circuits, but it will be appreciated that, in some embodiments, single-phase or any number of phases converter circuits may be used. The converter circuits 322, 324 may take the form of any of a variety of different types of converter circuits including, but not limited to, two-level or multi-level converter circuits.

As explained in a co-pending U.S. patent application Ser. No. 17/150,567 entitled "POWER CONVERTER BASED TRANSFORMER EMULATOR", filed concurrently herewith and incorporated herein by reference in its entirety, the circuit arrangement shown in FIG. 3 can be used to emulate a transmission line, transformer and/or other transmission path elements of an electrical power system. In particular, the first and second converter circuits 322, 324 may be used to emulate a voltage and/or current conversion function of the transmission path, while the third converter circuit 326 may be used to emulate losses associated with such a path.

As shown in FIG. 2, switches 122 may be used to selectively couple the transmission path emulator circuits 120 to the nodes 110. In some embodiments, such interconnect switching functions may be integrated or incorporated in the emulator circuits 120 themselves, without requiring use of the switches 122. For example, such selectively coupling and decoupling could be performed by the first and second converter circuits 322, 324 shown in FIG. 3.

Figure 4:
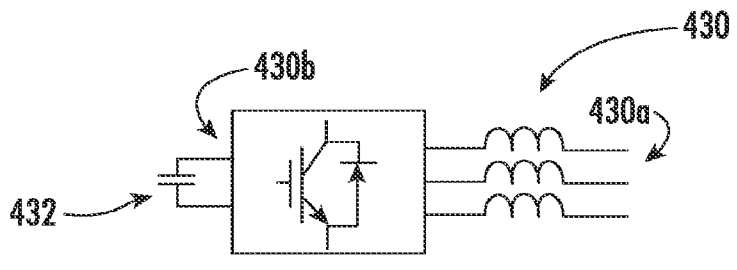

Referring to FIGS. 1 and 2, source/load emulator circuits 130 are configured to be selectively coupled to the nodes 110. The source/load emulator circuits 130 may be configured to emulate the behavior of power system sources (e.g., generators, energy storage devices and the like) and/or loads (e.g., consumer loads, energy storage devices, and the like). Referring to FIG. 4, the source/load emulator circuits 130 may take the form of DC/AC converter circuits 430, which include an AC port 430a that is configured to be connected to a node 110 of the emulator apparatus and a DC port 430b that is coupled to a load and/or source (e.g., an energy storage device). Examples of such source/load emulator circuits are described, for example, in the aforementioned U.S. Pat. No. 10,873,184 to Wang et al.

Switches 134 may be provided to selectively couple the source/load emulator circuits 130 to the nodes. In some embodiments, such interconnect switching functions may be integrated within the source/load emulator circuits 130 themselves, without requiring separate switches. For example, such selective interconnection may be provided by converter circuits 430 as shown in FIG. 4. As further shown, bypass circuits 124 may be provided to bypass the transmission path emulator circuits 120 to allow direct interconnection of adjacent ones of the nodes 110. Such bypass capability may be used, for example, to allow common connection of multiple ones of the source/load emulator circuits 130 to one of the nodes 110. In some embodiments, such bypass circuits function may be integrated within the transmission path emulator circuits 120 themselves, without requiring separate bypass circuits. For example, such bypass circuits could be implemented by the first and second converter circuits 322, 324 shown in FIG. 3.

As further shown in FIG. 2, the transmission path emulator circuits 120, the source/load emulator circuits 130, the interconnection switches 122 and the bypass circuits 124 may be controlled by at least one control circuit 140. The control circuit 140 may comprise one or more control circuits which may be implemented in a number of different ways, such as in control circuits that are included in emulator modules that include groups of the transmission path emulator circuits 120, the source/load emulator circuits 130, the interconnection switches 122 and the bypass circuits 124, as explained below with reference to FIGS. 8 and 9. The control circuit 140 may generally be implemented using any of a variety of different types of digital and/or analog circuitry, including, but not limited to microprocessor or microcontroller based circuitry that controls the transmission path emulator circuits 120, the source/load emulator circuits 130, the interconnection switches 122 and the bypass circuits 124 based on software instructions executed therein. The control circuit 140 can be configured to provide software configurability of the operations of the transmission path emulator circuits 120, the source/load emulator circuits 130, the interconnection switches 122 and the bypass circuits 124 as desired to implement different emulator configurations, such as the ones described below with reference to FIGS. 5A, 5B, 7A and 7B. The control circuit 140 may also include, for example, user interface circuitry (e.g., circuitry to interface with devices such as displays, keyboards and other user interface devices) to facilitate such configurability and to support, for example, extraction, storage and processing of data, such as data relating to states (e.g., voltage and current) of the emulator apparatus, for analytical and other uses.

Figure 5A:
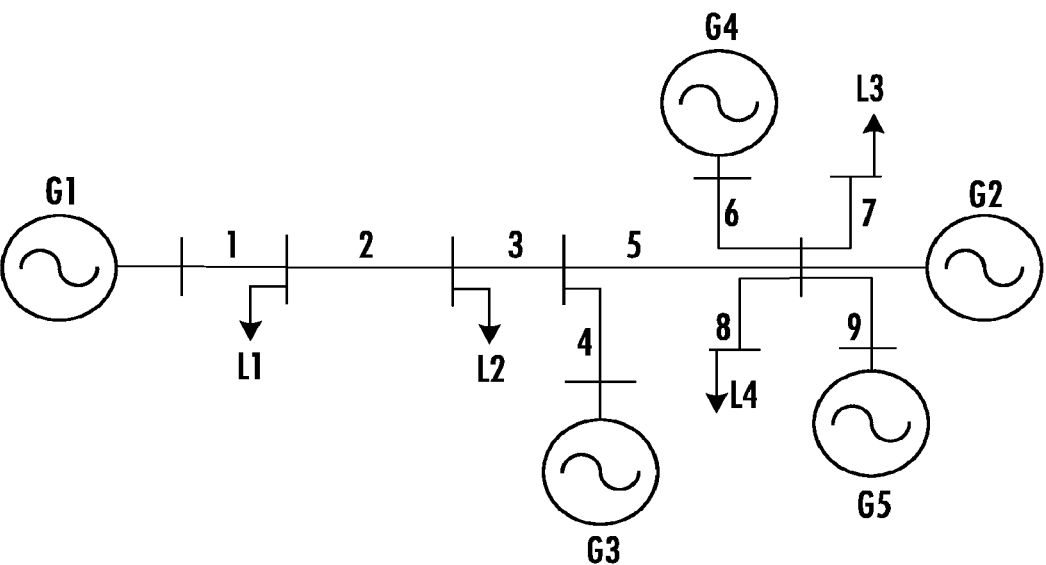
FIGS. 5A and 5B illustrate, respectively, an electrical power system and a configuration of the emulator of FIG. 1 for emulating the electrical power system according to some embodiments.
Figure 5B:
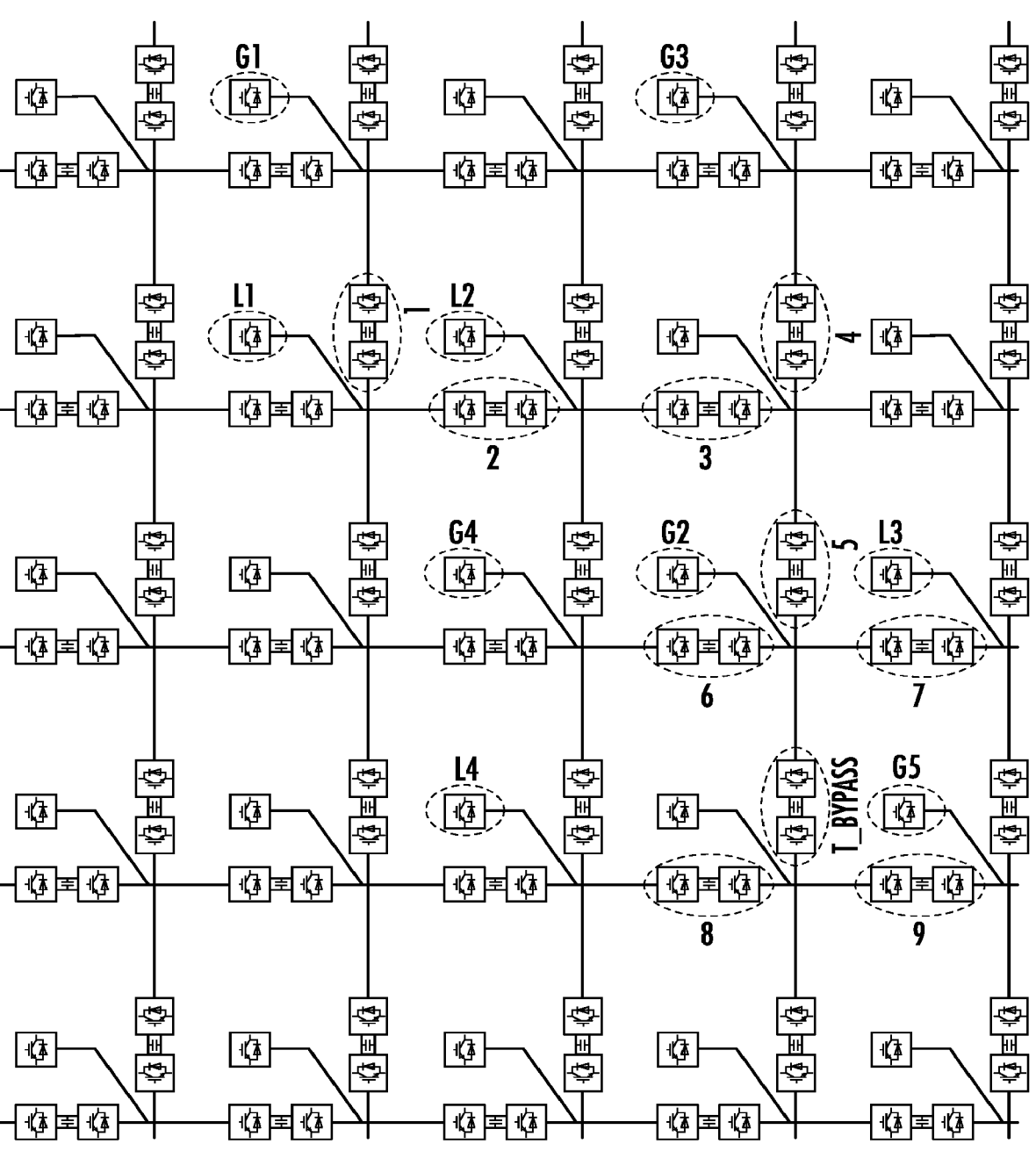

FIGS. 5A and 5B illustrate an example of how the emulator apparatus illustrated in FIG. 1 might be configured to emulate a particular power system arrangement by selectively coupling transmission path emulator circuits 120 and source/load emulator circuits 130 to the nodes 110 of the emulator apparatus. Referring to FIG. 5A, an electrical power transmission system to be emulated may include generators G1, G2, G3, G4, G5, loads L1, L2, L3, L4, and interconnecting transmission lines 1-9. Referring to FIG. 5B, this system may be emulated by operating the transmission path emulator circuits 120 and load/source emulator circuits 130 to emulate corresponding components, i.e., the transmission lines 1-9, generators G1, G2, G3, G4, G5 and loads L1, L2, L3, L4. As shown in FIG. 5B, transmission path emulator circuit 120 T_bypass is configured to be a low (e.g., near zero) impedance line for providing the bypass circuit function. It will be understood that a wide variety of different power systems may be emulated in a similar fashion by selectively operating the emulator circuits 120, 130 to form the desired system topology and mimic the operations of corresponding components (transmission lines, transformers, sources and loads) of the system being emulated.

Figures 6, 7A:
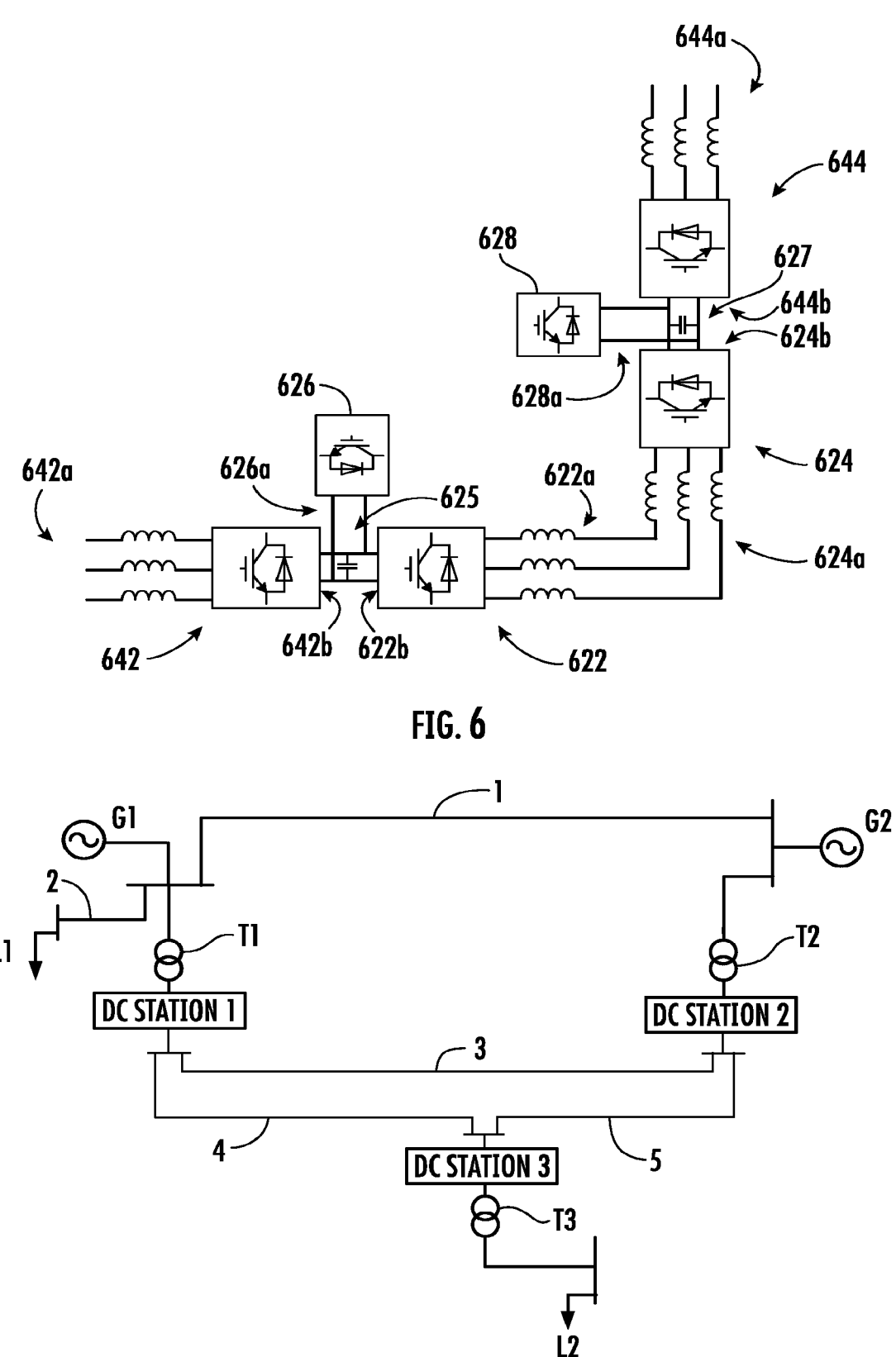
FIG. 6 is schematic diagram illustrating a DC transmission line path emulator and DC stations circuits.
FIGS. 7A and 7B illustrate, respectively, an electrical power system with DC transmission lines and stations, and a configuration of the emulator of FIG. 1 for emulating the electrical power system according to some embodiments.

FIG. 6 illustrates how the emulator apparatus in FIG. 1 can emulate DC transmission line and DC station. Referring to FIG. 6, the DC transmission line may include a first converter circuit 622 having an AC port 622a configured to be connected to one of the nodes 110 and DC port 622b connected to a DC bus 625, a second converter circuit 624 having a AC port 624a configured to be connected to the node 110 and DC port 624b connected to a DC bus 627, a third converter circuit 626 having a DC port 626a coupled to the DC bus 625, and a fourth converter circuit 628 having a DC port 628a coupled to the DC bus 627. As illustrated, the first and second converter circuit 622, 624 may be three-phase converter circuits, but it will be appreciated that, in some embodiments, single-phase or any number of phases of converter circuits may be used. The converter circuits 622, 624 may take the form of any of a variety of different types of converter circuits including, but not limited to, two-level or multi-level converter circuits. As shown in FIG. 6, the AC/DC converter circuits 642, 644 can be configured to emulate DC stations in DC system.

Referring to FIG. 6, the first and second converter circuits 622, 624 may be used to emulate voltage and/or current conversion function of the DC transmission path, while the third and/or fourth converter circuits 626, 628 may be used to emulate losses associated with such a path.

Figure 7B:
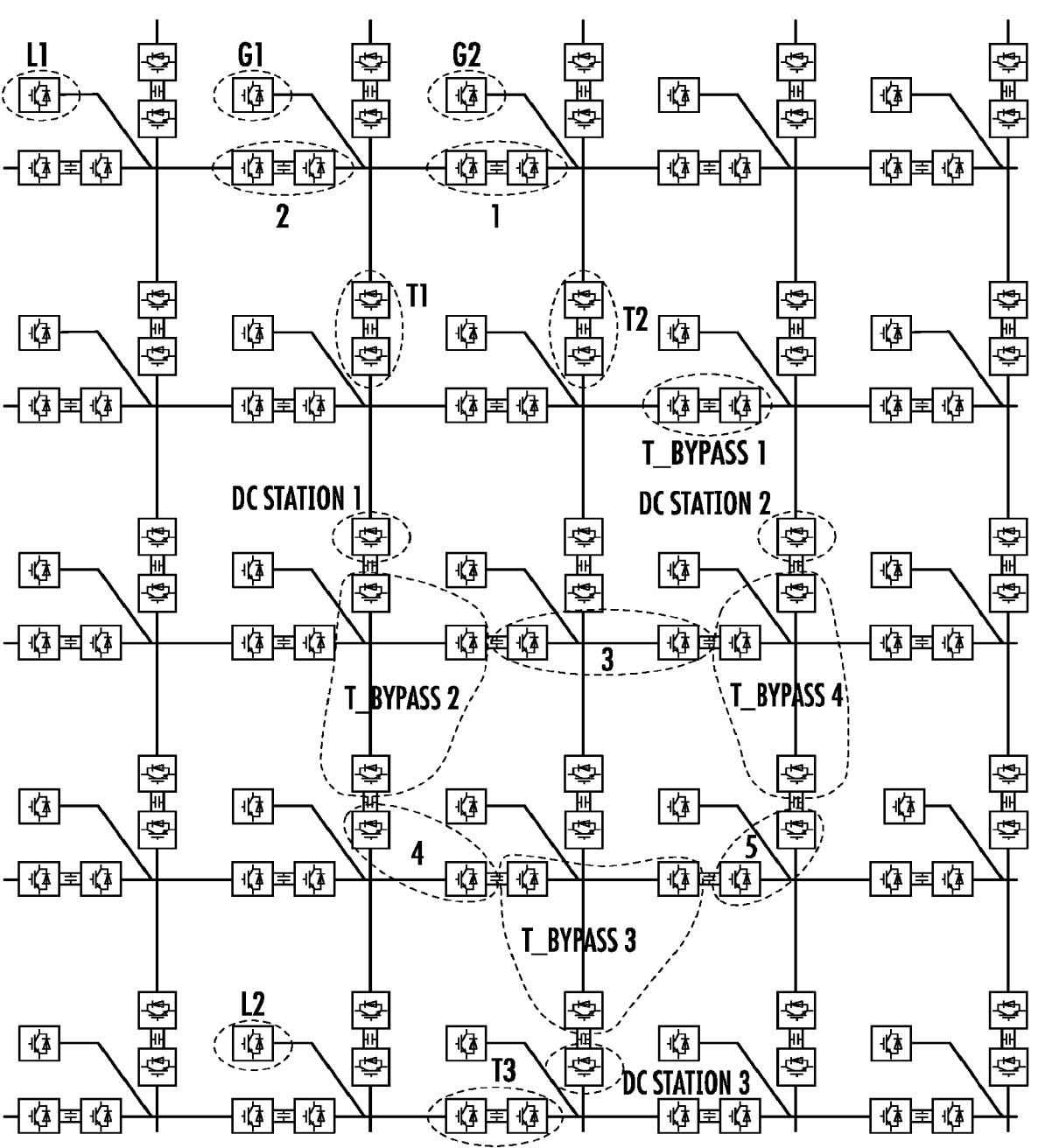

FIG. 7A and FIG. 7B illustrate an example of how the emulator apparatus illustrated in FIG. 1 might be configured to emulate a particular power system arrangement by selectively operating DC transmission path emulator circuits, DC station emulator circuits, source/load emulator circuits, AC transmission path emulator circuits, and transformer emulator circuits. Referring to FIG. 7A, an electrical power transmission system to be emulated may include generators G1, G2, loads L1, L2, transformers T1, T2, T3, DC transmission lines 3, 4, 5, AC transmission lines 1, 2, and DC stations 1, 2, 3. As shown in FIG. 7B, DC transmission path emulator circuit T_bypass 2, T_bypass 3, T_bypass 4 are configured to provide the bypass circuit function. It will be understood that a wide variety of different power systems may be emulated in a similar fashion by selectively operating the emulator circuits to form the desired system topology and mimic the operations of corresponding components (transmission lines, transformers, DC stations, sources and loads) of the system being emulated.

Figure 8:
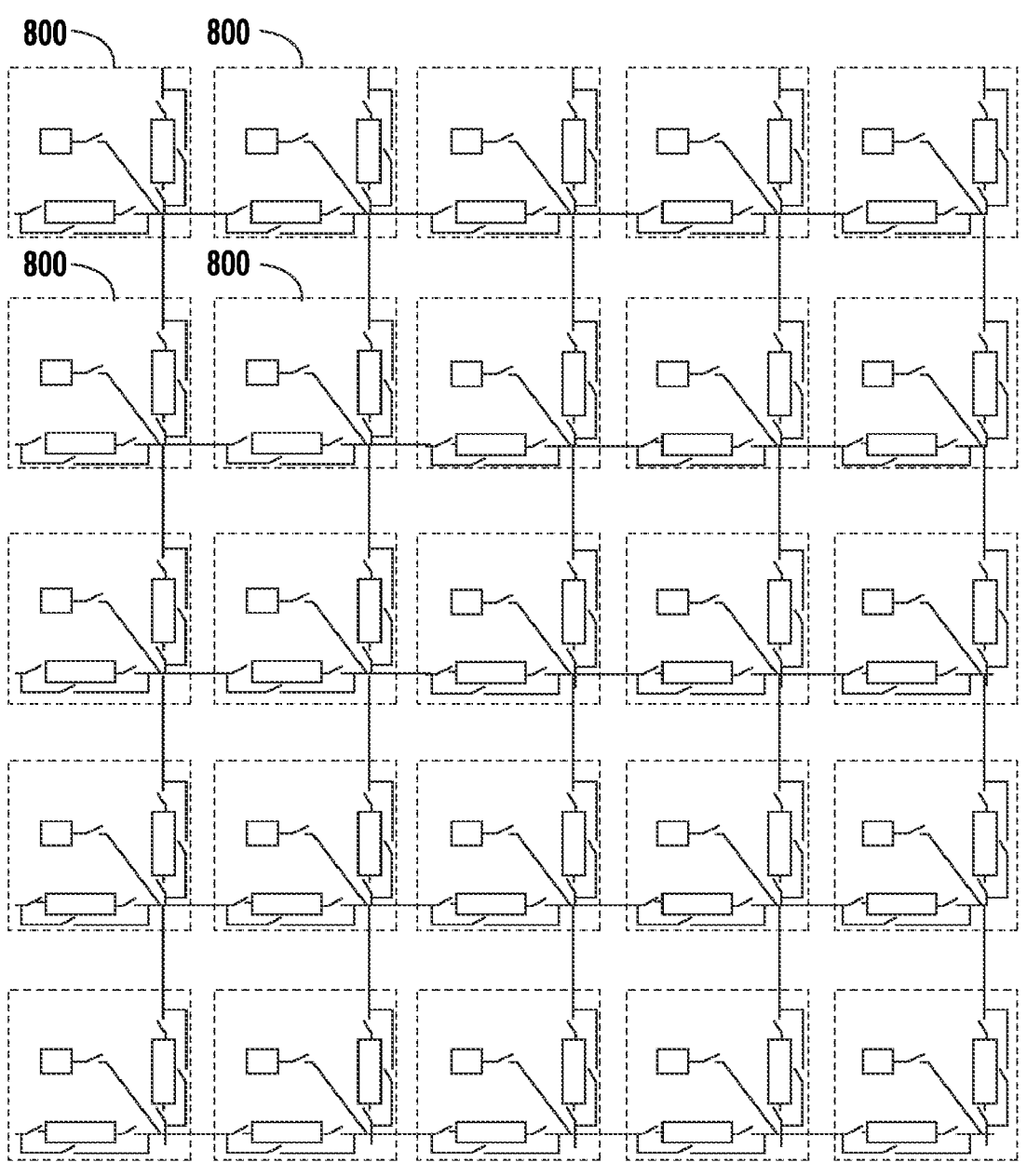
FIG. 8 is a schematic diagram illustrating a modular emulator assembly according to further embodiments.
Figure 9:
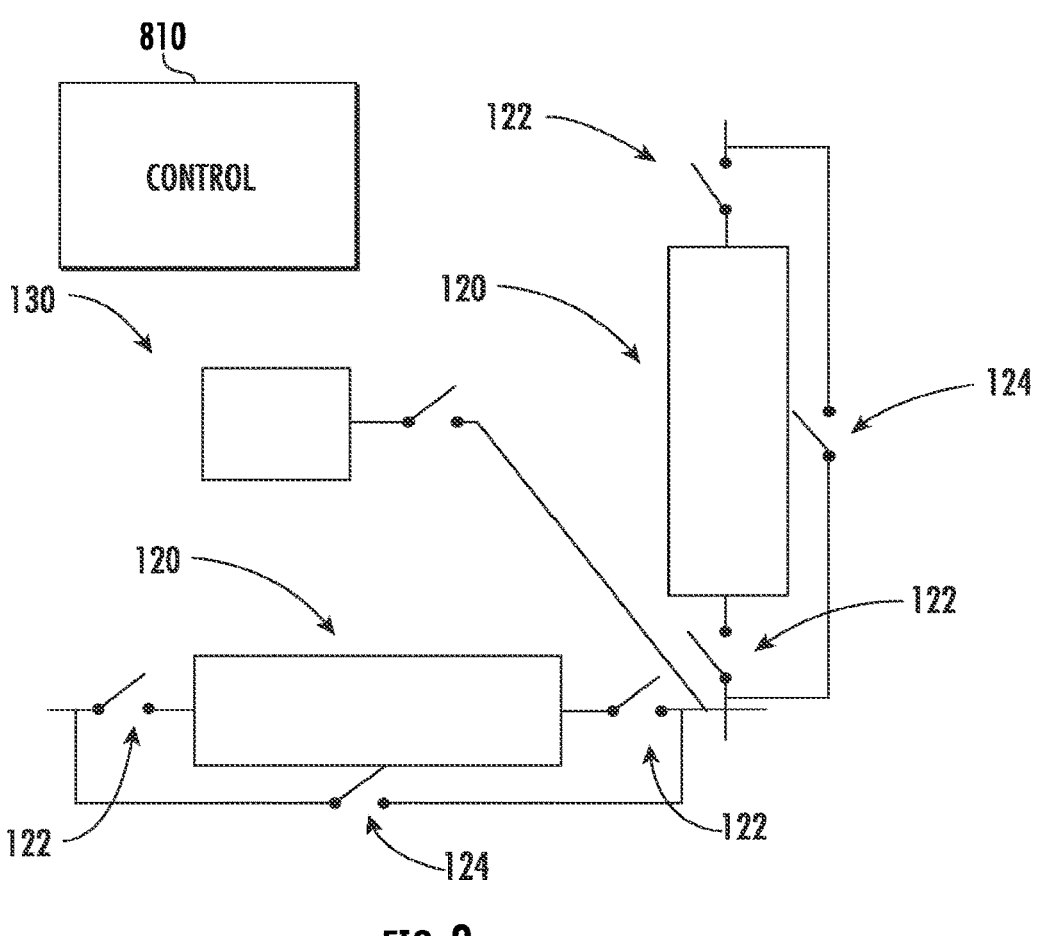
FIG. 9 is a schematic diagram illustrating an emulator module for the assembly of FIG. 8 according to further embodiments.

According to further embodiments, a software configurable emulator apparatus along the lines of that illustrated in FIG. 1 may be implemented in a modular fashion that can provide a scalability that can facilitate emulation of systems of a variety of different sizes and levels of complexity. Referring to FIGS. 8 and 9, the emulator apparatus may be implemented as a plurality of interconnected modules 800, each of which includes at least two transmission line emulator circuits 120 and at least one source/load emulator circuit 130, along with a control circuit 810 that is configured to control the emulator circuits 120, 130 and the associated interconnection and bypass switches 122, 124. The interconnection and bypass circuit functions of 122, 124 could be integrated into the emulator circuit 120, 130. The modules 800 are configured to be interconnected at the nodes 110.

Figure 10:
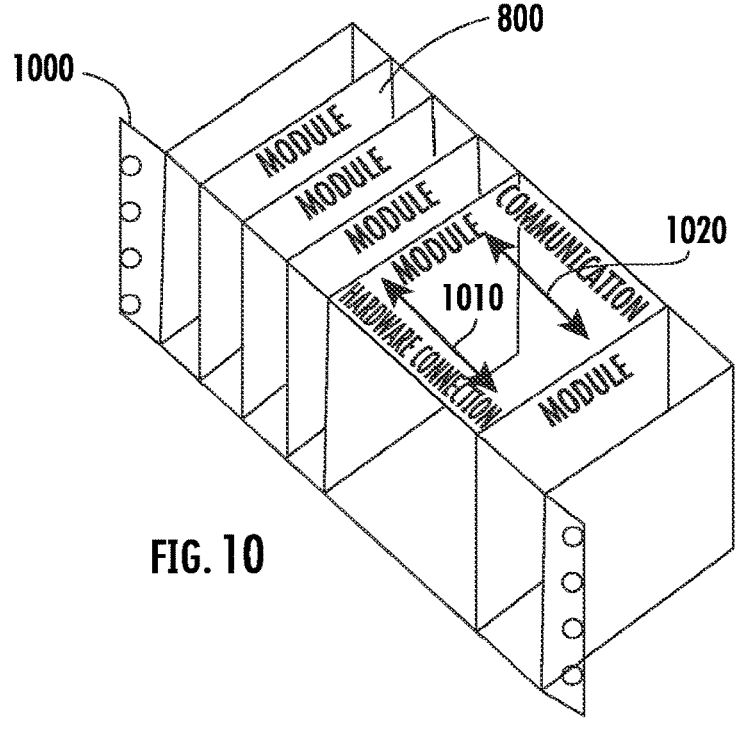
FIG. 10 is a view of a chassis configured for installation of multiple emulator modules along the lines illustrated in FIG. 9.

Referring to FIG. 10, the modules 800 may be implemented as respective circuit cards or other circuit assemblies that are configured to be installed in a chassis 1000. The chassis 1000 may include power interconnection circuitry

1010, such as wiring that coincides with the nodes 110 of the emulator apparatus and that is configured to be coupled to the modules 800 such that the modules 800 are interconnected at the nodes 110. Such wiring may, for example, take the form of traces provided on a backplane or similar structure in the chassis 1000. The chassis 1000 may further include control circuitry 1020 that supports communications with the control circuits 810 of the modules. For example, the control circuits 810 may be configured to communicate using serial communications buses or similar arrangements, and the control circuitry 1020 may include wiring on a backplane and other circuitry that supports such communications. Such communications circuitry may be used, for example, by a system controller (not shown in FIG. 10) installed in the chassis 1000 or elsewhere that controls the various modules 800 installed in the chassis 1000 to configure the modules 800 and operate the emulator circuitry thereof to emulate various electric power systems.

Figure 11:
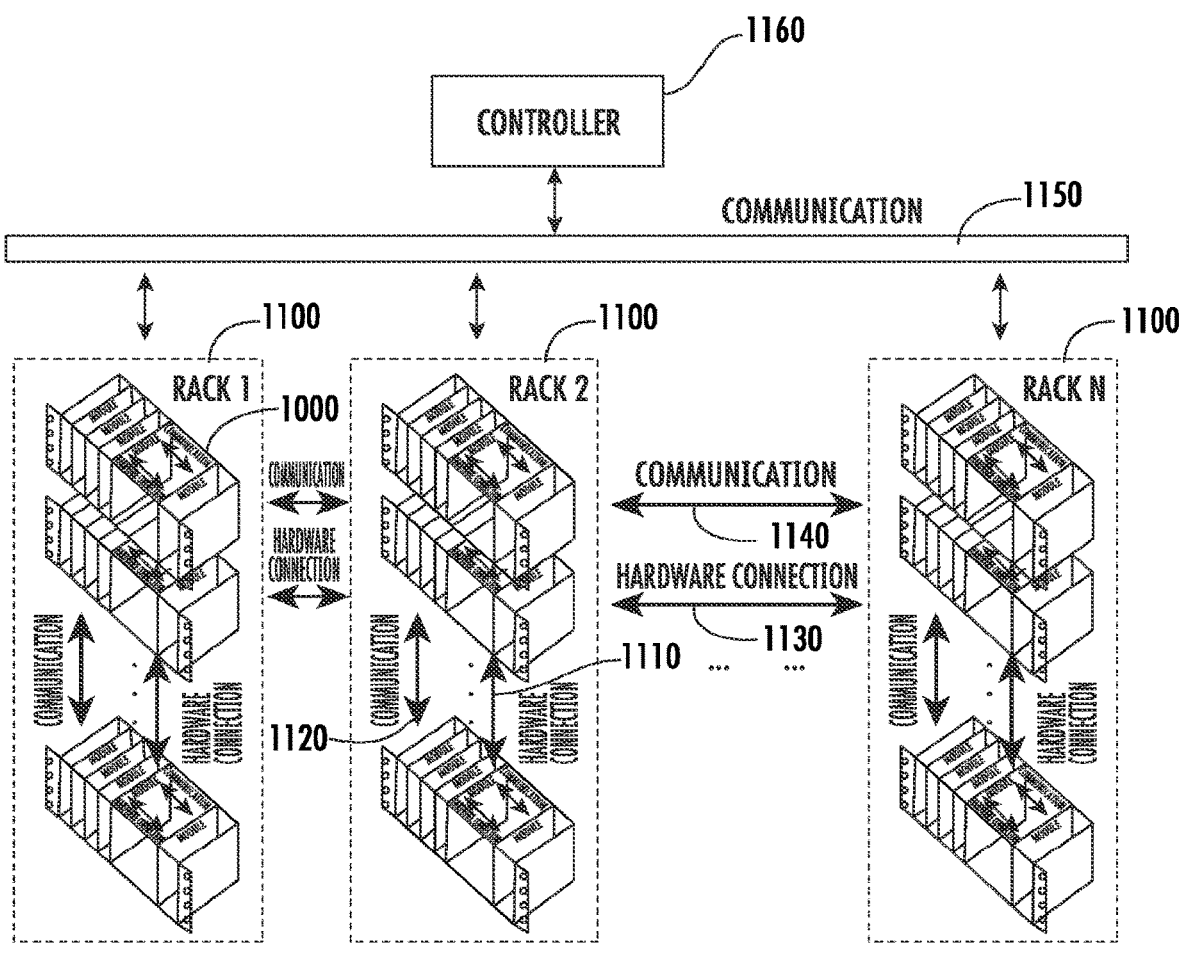
FIG. 11 is a schematic diagram illustrating a scalable emulator apparatus having a rack/chassis architecture employing multiple chassis along the lines of FIG. 10 according to further embodiments.

As shown in FIG. 11, the chassis 1000 may, in turn, serve as a modular component of a scalable system comprising racks 1100 that are configured to receive multiple ones of the chassis 1000, enabling expansion to emulate more extensive and complex electrical power systems. Similar to the chassis 1000, each of the racks 1100 may include power interconnection circuitry 1110 and control interconnection circuitry 1120 that may be used to interconnect the multiple chassis 1000 in the rack 1100. The racks 1100 may, in turn, be interconnected using power interconnection circuitry 1130 and control interconnection circuitry 1140, which may communicate with a system controller 1160 via a system control bus 1150. The system controller 1160 may be operative to configure, control and monitor operations of the emulator modules 800 in the racks 1100.

Figure 12:
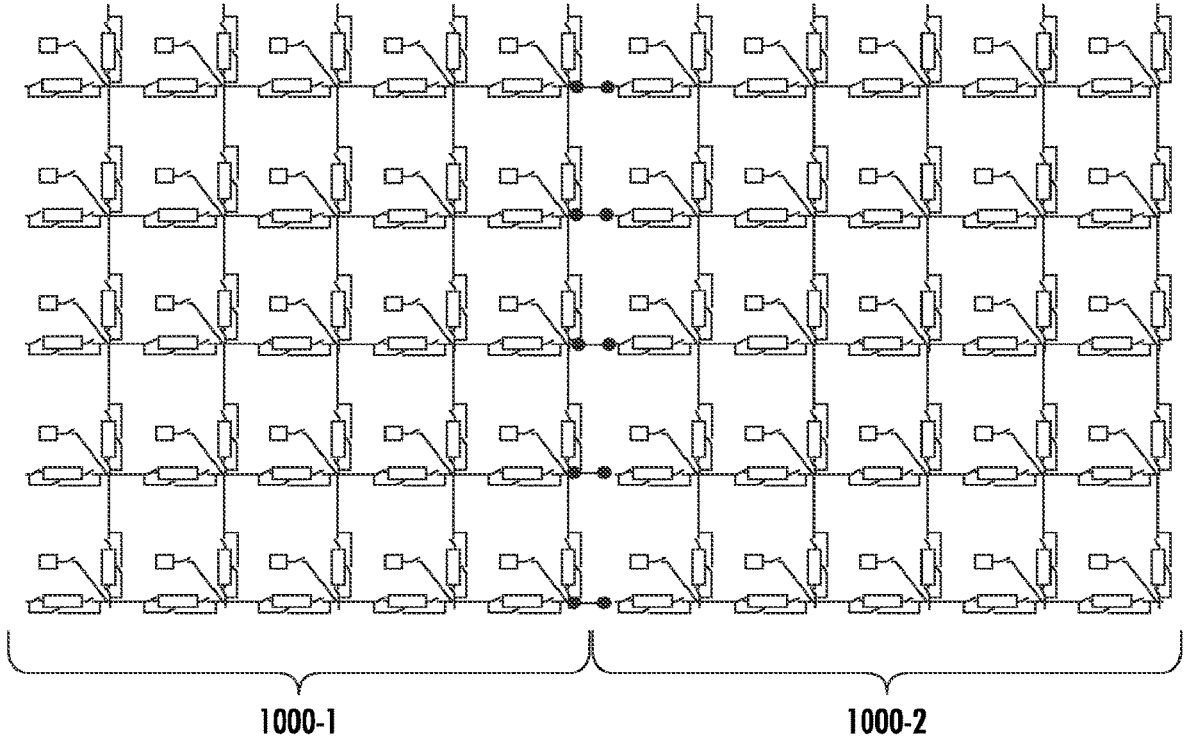
FIGS. 12 and 13 are schematic diagrams illustrating potential interconnections of modular emulator chassis according to further embodiments.
Figure 13:
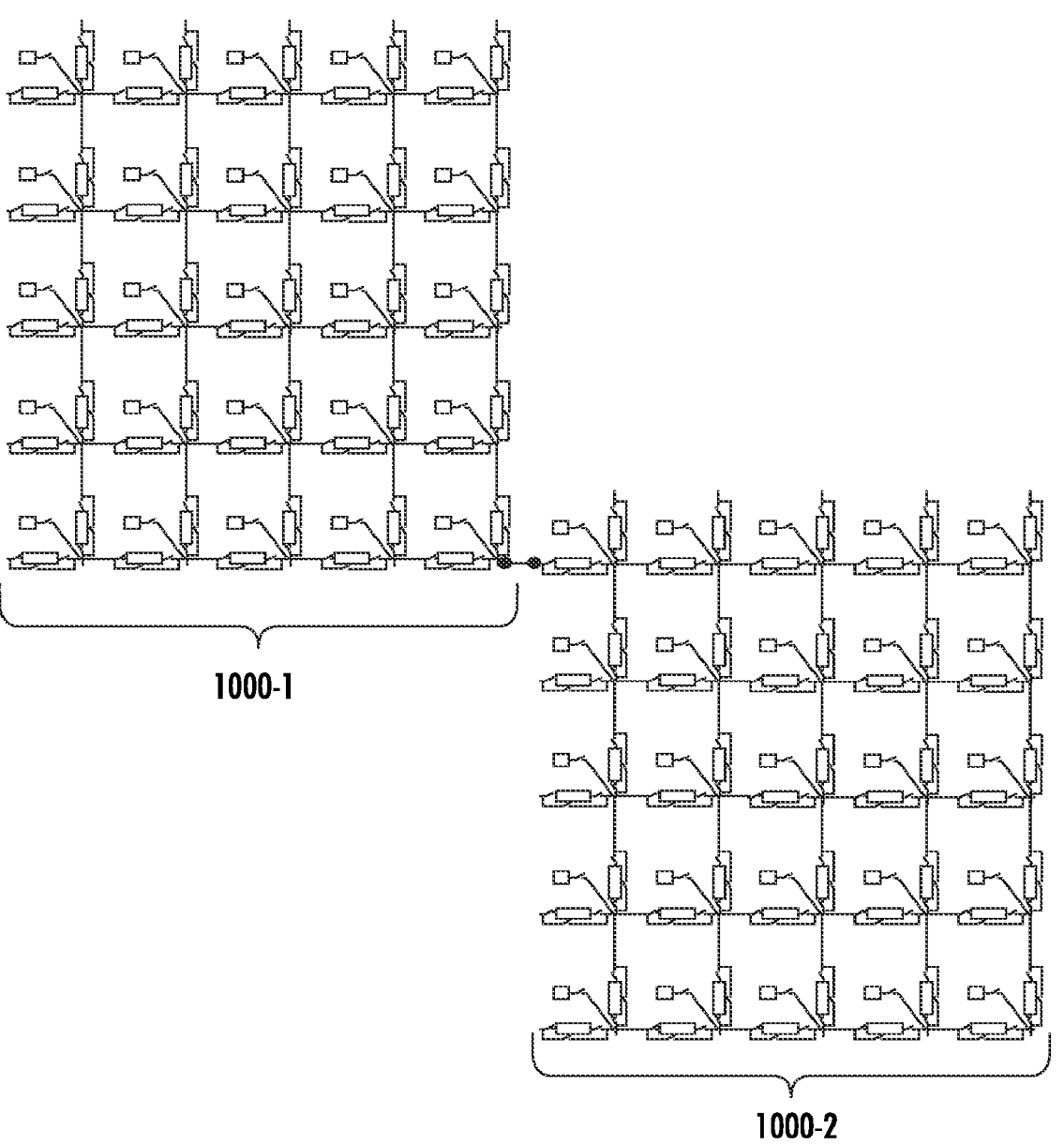

The modular, scalable arrangements illustrated in FIGS. 8-11 may enable emulation of a variety of different system topologies. For example, as shown in FIG. 12, nodes, transmission path emulators and load/source emulators from first and second chassis 1000-1, 1000-2 may be interconnected to provide an expanded rectilinear matrix, which may be useful, for example, for emulating a relatively large electrical power system, such as a relatively large microgrid or a utility grid. However, the interconnection of chassis such as the chassis 1000-1, 1000-2 can be varied. For example, as shown in FIG. 13, the chassis 1000-1, 1000-2 may be connected in an offset manner, which might be useful, for example, in emulation of two grids that are coupled by a single intertie. Arrangements similar to those in FIGS. 12 and 13 could also be implemented with multiple racks house multiple module-filled chassis, such as the racks 1100 of FIG. 11.

The drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An electric power system emulator apparatus comprising:
    a chassis;
    a plurality of emulator modules in the chassis, each of the emulator modules comprising:
        first and second transmission path emulator circuits, each having first ports configured to be connected to one another and second ports configured to be connected to another of the emulator modules;

a first bypass circuit integrated into and configured to bypass the first transmission path emulator circuit;

a second bypass circuit integrated into and configured to bypass the second transmission path emulator circuit;

a power node emulator circuit configured to emulate at least one of a source or a load, the power node emulator circuit configured to be connected to the first ports of the first and second transmission path emulator circuits; and a control circuit in communication with and configured to control each of the first transmission path emulator circuit, the second transmission path emulator circuit, the first bypass circuit, the second bypass circuit, and the power node emulator circuit.

2. The apparatus of claim 1, wherein each module further comprises switches that couple and decouple the first and second transmission path emulator circuits and the power node emulator circuit.

3. The apparatus of claim 2, wherein the switches are integrated into the first and second transmission path emulator circuits and the power node emulator circuit.

4. The apparatus of claim 1, further comprising interconnection circuitry in the chassis configured to support interconnection of the emulator modules to form a plurality of nodes arrayed in first and second dimensions such that respective ones of the first and second transmission path emulator circuits are configured to be connected between adjacent ones of the nodes in the first and second dimensions and respective ones of the power node emulator circuits are configured to be connected to respective ones of the nodes.

5. The apparatus of claim 1, wherein the first and second transmission path emulator circuits comprise respective first and second power electronics converter circuits.

6. The apparatus of claim 1, wherein the power node emulator circuit comprises a power electronics converter circuit.

7. A system comprising multiple ones of the electric power system apparatuses installed and interconnected in a rack, wherein each electric power system emulator apparatus comprises:

a chassis;

a plurality of emulator modules in the chassis, each of the emulator modules comprising:

first and second transmission path emulator circuits, each having first ports configured to be connected to one another and second ports configured to be connected to another of the emulator modules;

a first bypass circuit integrated into and configured to bypass the first transmission path emulator circuit;

a second bypass circuit integrated into and configured to bypass the second transmission path emulator circuit;

a power node emulator circuit configured to emulate at least one of a source or a load, the power node emulator circuit configured to be connected to the first ports of the first and second transmission path emulator circuits; and a control circuit in communication with and configured to control each of the first transmission path emulator circuit, the second transmission path emulator circuit, the first bypass circuit, the second bypass circuit, and the power node emulator circuit.

8. The system of claim 7, further comprising interconnection circuitry in the rack configured to support interconnection of the emulator modules of the chassis of each of the electric power system emulator apparatuses to form a plurality of nodes arrayed in first and second dimensions, such that respective ones of the first and second transmission path emulator circuits are configured to be connected between adjacent ones of the nodes in the first and second dimensions, and respective ones of the power node emulator circuits are configured to be connected to respective ones of the nodes.

9. The system of claim 7, wherein each emulator module further comprises switches that couple and decouple the first and second transmission path emulator circuits and the power node emulator circuit.

10. The system of claim 9, wherein the switches are integrated into the first and second transmission path emulator circuits and the power node emulator circuit.

11. The system of claim 7, wherein the first and second transmission path emulator circuits comprise respective first and second power electronics converter circuits.

12. The system of claim 7, wherein the power node emulator circuit comprises a power electronics converter circuit.

13. An electric power system emulator apparatus comprising:

a chassis;

a plurality of emulator modules in the chassis, each of the emulator modules comprising:

first and second transmission path emulator circuits, each having first ports configured to be connected to one another and second ports configured to be connected to another of the emulator modules;

a plurality of power node emulator circuits configured to emulate at least one of a source or a load, each power node emulator circuit being configured to be connected to the first ports of the first and second transmission path emulator circuits of a corresponding one of the plurality of emulator modules;

interconnection circuitry in the chassis configured to support interconnection of the plurality of emulator modules to form a plurality of nodes arrayed in first and second dimensions such that respective ones of the first and second transmission path emulator circuits are configured to be connected between adjacent ones of the plurality of nodes in the first and second dimensions and respective ones of the power node emulator circuits are configured to be connected to respective ones of the nodes, and a control circuit in communication with and configured to control each of the first transmission path emulator circuit, the second transmission path emulator circuit, and the plurality of power node emulator circuits.

14. The apparatus of claim 13, wherein each of the plurality of emulator modules further comprises one or more switches that couple and decouple the first and second transmission path emulator circuits and a respective power node emulator circuit.

15. The apparatus of claim 14, wherein the one or more switches are integrated into the first and second transmission path emulator circuits and the respective power node emulator circuit.

* * * * *